United States Patent
Chueh et al.

(10) Patent No.: US 9,023,663 B2
(45) Date of Patent: May 5, 2015

(54) METHOD FOR PREPARING NANO-SHEET ARRAY STRUCTURE OF GROUP V-VI SEMICONDUCTOR

(71) Applicant: National Tsing Hua University, Hsinchu (TW)

(72) Inventors: Yu-Lun Chueh, Hsinchu (TW); Hung-Wei Tsai, Hsinchu (TW); Tsung-Cheng Chan, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/265,898

(22) Filed: Apr. 30, 2014

(65) Prior Publication Data
US 2014/0329338 A1 Nov. 6, 2014

(30) Foreign Application Priority Data
May 2, 2013 (TW) .............................. 102115752 A

(51) Int. Cl.
*H01L 21/00* (2006.01)
*H01L 35/34* (2006.01)

(52) U.S. Cl.
CPC ...................................... *H01L 35/34* (2013.01)

(58) Field of Classification Search
None
See application file for complete search history.

(56) References Cited

U.S. PATENT DOCUMENTS

2010/0133110 A1* 6/2010 Nocera et al. ................. 205/340

OTHER PUBLICATIONS

Tsai et al., "Fabrication of Large Scale Single Crystal Bismuth Telluride (Bi2Te3) Nanosheet Arrays by Single Step Electrolysis Process", Nanoscale, Mar. 26, 2014., 19 pages.
Tsai et al., "Fabrication of large scale single crystal $Bi_2Te_3$ nanosheet arrays via one-step electrolysis process," E-MRS 2013, 11 pp.
Tsai et al., "Fabrication of large scale single crystal $Bi_2Te_3$ nanosheet arrays via one-step electrolysis process," Annual Meeting of the Physical Society of Republic of China, 2013, Department of Materials Science and Engineering, National Tsing Hua University.

* cited by examiner

*Primary Examiner* — Kyoung Lee
(74) *Attorney, Agent, or Firm* — Muncy, Geissler, Olds & Lowe, P.C.

(57) ABSTRACT

The object of the present invention is to provide a method for preparing a nano-sheet array structure of a Group V-VI semiconductor, comprising: (A) providing an electrolyte containing a hydrogen ion and disposing an auxiliary electrode and a working electrode in the electrolyte, wherein the working electrode comprises a Group V-VI semiconductor bulk; and (B) applying a redox reaction bias to the auxiliary electrode and the working electrode to form a nano-sheet array structure on the bulk.

10 Claims, 1 Drawing Sheet

METHOD FOR PREPARING NANO-SHEET ARRAY STRUCTURE OF GROUP V-VI SEMICONDUCTOR

CROSS REFERENCE TO RELATED APPLICATION

This application claims the benefits of the Taiwan Patent Application Serial Number 102115752, filed on May 2, 2013, the subject matter of which is incorporated herein by reference.

BACKGROUND OF THE INVENTION

1. Field of the Invention

The present invention relates to a method for preparing a nano-sheet array structure of a Group V-VI semiconductor; and more specifically, to a method for preparing a nano-sheet array structure of a Group V-VI semiconductor by applying a redox reaction bias.

2. Description of Related Art

Group V-VI semiconductor thermoelectric materials are the class having the best thermoelectric figure of merit at room temperature among all thermoelectric materials, and have a potential for applications in energy conversion and cooling systems. Unlike traditional cooling designs using a compressor and pipelines, solid bismuth telluride-based thermoelectric materials can be advantageously processed into a micro-scale thermoelectric device for chip scale micro-electromechanical components. It still needs a continuous effort for the scientists to keep improving the thermoelectric figure of merit of thermoelectric materials. Nano-structured bismuth telluride-based materials have been proven to effectively and significantly improve the performance of thermoelectric figure of merit both theoretically and experimentally.

The thermoelectric efficiency of a thermoelectric material may be evaluated by the figure of merit ZT: $ZT=S^2T\sigma/\kappa$, wherein T is the absolute temperature, $\sigma$ is the electrical conductivity, $\kappa$ is the thermal conductivity. The thermal conductivity can be reduced by increasing the probability of phonon boundary scattering, the electrical conductivity can be increased using quantum confinement, and the nano-structure has been proven to enhance the ZT value.

At present, the typical methods for preparing a nanoscale thermoelectric material include mechanical stripping, metal ion intercalation and rapid thermal stripping. However, the application of these methods is rather limited, because complicated processes and higher manufacturing costs are required to produce the desired nanoscale thermoelectric material, not suited for mass production.

Accordingly, what is needed in the art is to provide a nano-structured material of a Group V-VI semiconductor and a preparing method thereof, which provides a low-cost, relatively simple process for realizing mass production, and a wide range of applications.

SUMMARY OF THE INVENTION

An object of the present invention is to provide a method for preparing a nano-sheet array structure of a Group V-VI semiconductor bulk, to provide an adjustable and applicable nano-sheet array structure.

To achieve the above object, the present invention provides a method for preparing a nano-sheet array structure of a Group V-VI semiconductor, comprising the following steps: (A) providing an electrolyte containing a hydrogen ion and disposing an auxiliary electrode and a working electrode in the electrolyte, wherein the working electrode comprises a Group V-VI semiconductor bulk; and (B) applying a redox reaction bias to the auxiliary electrode and the working electrode, to form a nano-sheet array structure on the bulk. Therefore, in the present invention, a redox reaction bias is applied to a surface of the Group V-VI semiconductor bulk, to form a large-surface area nano-sheet array structure.

In the present invention, the applied redox reaction bias can further produce a reduction peak potential to thereby conduct an electrochemical reaction between the Group V-VI semiconductor bulk and the electrolyte solution to form a nano-sheet array structure.

The large-surface area nano-sheet array structure according to the present invention preferably has a length of 100 to 999 μm and a width of 100 to 999 μm.

In the present invention, the step (A) may further include a reference electrode as the measurement standard.

The electrolyte containing a hydrogen ion is not particularly limited. Preferably, the electrolyte containing a hydrogen ion is an acidic solution of hydrochloric acid, nitric acid, or sulfuric acid.

The Group V-VI semiconductor bulk is not particularly limited, and preferably made of bismuth telluride, antimony telluride, bismuth selenide, bismuth antimony telluride or tellurium bismuth selenide.

The nano-sheet array structure of the present invention may further comprise a plurality of recesses. The plurality of the recesses may have a depth of 2 to 900 μm, and more preferably 100 to 600 μm. The depth of the plurality of the recesses may be regulated by the intensity and time period of the applied redox reaction bias.

The redox reaction bias of the present invention is preferably −5V to −25V, and more preferably −2V to −20V.

The redox reaction bias of the present invention is preferably applied for 10-500 seconds, and more preferably 30-300 seconds.

In the step (B) of the present invention step, a nanowire byproduct may be produced, the nanowire byproduct may be a selenium nanowire or a tellurium nanowire.

DETAILED DESCRIPTION OF THE PREFERRED EMBODIMENT

The present invention will now be explained in further detail with reference to the following examples. However, these examples are merely illustrative of the present invention, the scope of which shall not be construed to be limited by the following examples.

In the present invention, the term "small bias" is defined within a range of −2 to −10V, and the term "large bias" is defined within a range of −10 to −20V.

Example 1

Figure 1:
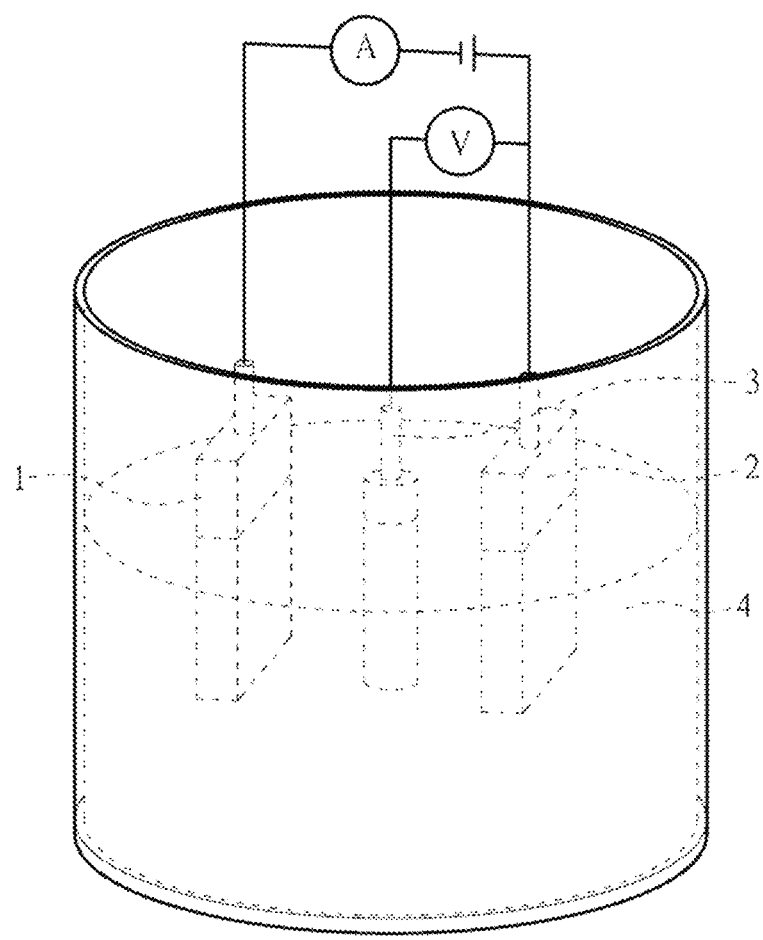
FIG. 1 is a schematic diagram of the method for preparing a nano-sheet array structure of a Group V-VI semiconductor according to the present invention.
Figure 2:
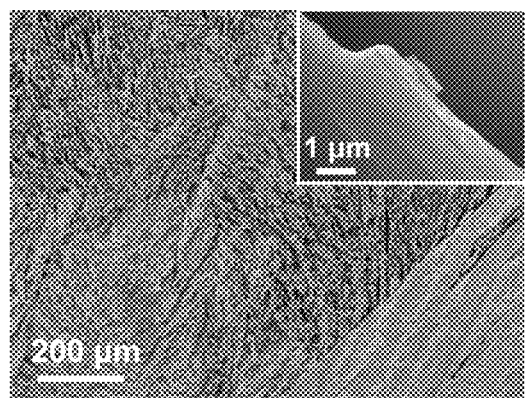
FIG. 2 shows a SEM picture of the nano-sheet array structure according to the present invention.

FIG. 1 shows a schematic diagram of the method for preparing a nano-sheet array structure of a Group V-VI semiconductor according to the present invention. In this Example, an electrolytic solution 4 of hydrochloric acid was provided, and diluted with deionized water to a pH value of about 1.25. An auxiliary electrode 1 and a working electrode 2 were disposed in the electrolyte solution 4, wherein the auxiliary electrode 1 was a platinum electrode and the working electrode 2 was a bismuth telluride semiconductor bulk. In addition, a redox reaction bias of −20V was applied to the auxiliary electrode 1 and the working electrode 2 for 30 seconds, and the redox reaction bias produced a reduction peak potential to thereby conduct an electrochemical reaction between the bismuth telluride bulk and the electrolyte to form a nano-sheet array structure.

The nano-sheet array structure formed on the surface of the bismuth telluride had a length of 100 to 300 μm and a width of 100 to 300 μm. The plurality of recesses formed on the surface of bismuth telluride had a depth of 10 to 90 μm. In addition, a tellurium nanowire byproduct was produced in Example 1.

Example 2

The steps were substantially the same as in Example 1, except that the electrolyte was sulfuric acid. The nano-sheet array structure formed in this Example had a length of 100 to 300 μm and a width of 100 to 300 μm, and the recesses formed on the surface had a depth of 10 to 90 μm.

Example 3

The steps were substantially the same as in Example 1, except that the electrolyte was nitric acid. The nano-sheet array structure formed in this Example had a length of 100 to 300 μm and a width of 100 to 300 μm, and the recesses formed on the surface had a depth of 10 to 90 μm.

It can be known from the nano-sheet array structure obtained in Examples 1, 2 and 3 that the method of the present invention only needs the electrolyte to have the hydrogen ion (i.e. an acid solution), that is, a common acid solution can be used to form a large-surface area nano-sheet array structure on the surface of bismuth telluride.

Example 4

The steps were substantially the same as in Example 1, except that the redox reaction bias was −15 V and applied for 45 seconds. The nano-sheet array structure formed in this Example had a length of 600 to 900 μm and a width of 600 to 900 μm, and the recesses formed on the surface had a depth of 30 to 500 μm.

Example 5

The steps were substantially the same as in Example 1, except that the redox reaction bias was −10 V and applied for 60 seconds. The nano-sheet array structure formed in this Example had a length of 650 to 800 μm and a width of 650 to 800 μm, and the recesses formed on the surface had a depth of 100 to 500 μm.

Example 6

The steps were substantially the same as in Example 1, except that the redox reaction bias was −5 V and applied for 120 seconds. The nano-sheet array structure formed in this Example had a length of 800 to 900 μm and a width of 800 to 900 μm, and the recesses formed on the surface had a depth of 200 to 600 μm.

Example 7

The steps were substantially the same as in Example 1, except that the redox reaction bias was −2 V and applied for 300 seconds. The nano-sheet array structure formed in this Example had a length of 850 to 990 μm and a width of 850 to 990 μm, and the recesses formed on the surface had a depth of 300 to 650 μm.

It can be known from the above-described Examples 1 and 4-7 that the depth of the nano-sheet array structure may be regulated by the intensity and time period of the applied redox reaction bias. By fixing the total number of passing charges, the relationship between the nano-sheet array structure and the intensity of the applied bias was observed. The nano-sheet array structure having a depth of 2 nm to 900 μm can be formed on the surface of bismuth telluride within a few minutes under a small bias and within a few seconds under a large bias, so that the method of the invention has the advantage of fast processing.

Example 8

The steps were substantially the same as in Example 1, except that the bulk 4 of bismuth telluride was replaced by the bulk of antimony telluride, bismuth selenide, and bismuth antimony telluride, respectively. The nano-sheet array structure formed in this Example had a length of 400 to 900 μm and a width of 400 to 900 μm, and the recesses formed on the surface had a depth of 200 to 650 μm. The formed byproducts were the tellurium nanowire and the selenide nanowire. Various byproducts generated in this Example for a wide range of applications.

Example 9

The steps were substantially the same as in Example 1, except that a reference electrode 3 of $Hg/Hg_2Cl_2$ (saturated KCl) was introduced. The reference electrode 3 was a calomel electrode. The nano-sheet array structure formed in this Example had a length of 600 to 900 μm and a width of 600 to 900 μm, and the recesses formed on the surface had a depth of 300 to 500 μm. The formed byproduct was the tellurium nanowire.

It can be known from the above-described Examples 1 and 8 that the method of the invention only requires a two-electrode system for realizing commercial mass production of the nano-sheet array structures, thus having the advantage of cost saving.

As compared with the epitaxial growth and lithography processes commonly used in the art, the method for preparing a nano-sheet array structure according to the present invention is featured by a simple preparation for the electrolyte, a simple electrochemical device, and convenient, and fast processing, thereby reducing the production cost and being suitable for mass production, such that the thermoelectric materials made by the nano-sheet structure can be widely used in various industries. Furthermore, the present invention has short reaction time for the nano-sheet array structure and is applicable for a wide variety of materials, both of which cannot be achieved by the conventional art.

Thermoelectric materials made of the nano-sheet array structure of a V-VI semiconductor can be widely used in various industries, for example in the energy conversion system or a cooling system. Therefore, the method of the present invention processes industrial applicability.

Although the present invention has been explained in relation to its preferred Example, it is to be understood that many other possible modifications and variations can be made without departing from the spirit and scope of the invention as hereinafter claimed.

What is claimed is:

1. A method for preparing a nano-sheet array structure of a Group V-VI semiconductor, comprising:
   (A) providing an electrolyte containing a hydrogen ion and disposing an auxiliary electrode and a working electrode in the electrolyte, wherein the working electrode comprises a Group V-VI semiconductor bulk; and
   (B) applying a redox reaction bias to the auxiliary electrode and the working electrode to form a nano-sheet array structure on the bulk.

2. The method of claim 1, wherein the electrolyte is an acidic solution of hydrochloric acid, nitric acid, or sulfuric acid.

3. The method of claim 1, wherein the Group V-VI semiconductor bulk is made of bismuth telluride, antimony telluride, bismuth selenide, bismuth antimony telluride, or tellurium bismuth selenide.

4. The method of claim 1, wherein the nano-sheet array structure further comprises a plurality of recesses.

5. The method of claim 1, wherein the plurality of recesses have a depth of 2 to 900 μm.

6. The method of claim 1, wherein the redox reaction bias is −5V to −25V.

7. The method of claim 6, wherein the redox reaction bias is −2V to −20V.

8. The method of claim 1, wherein the redox reaction bias is applied for 10-500 seconds.

9. The method of claim 1, wherein, the step (B) further comprises: producing a nanowire.

10. The method of claim 9, wherein, the nano wire is a tellurium nanowire or a selenium nanowire.

\* \* \* \* \*